US008710508B2

(12) United States Patent
Kim

(10) Patent No.: US 8,710,508 B2
(45) Date of Patent: Apr. 29, 2014

(54) ORGANIC LIGHT EMITTING DIODE DISPLAY DEVICE AND METHOD OF FABRICATING THE SAME

(75) Inventor: Eun-Ah Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 748 days.

(21) Appl. No.: 12/360,379

(22) Filed: Jan. 27, 2009

(65) Prior Publication Data

US 2009/0189162 A1  Jul. 30, 2009

(30) Foreign Application Priority Data

Jan. 28, 2008  (KR) .................. 10-2008-0008723

(51) Int. Cl.
*H01L 51/50* (2006.01)
(52) U.S. Cl.
USPC .. 257/72; 257/40; 257/E33.062; 257/E51.022
(58) Field of Classification Search
USPC .................. 257/72, 40, E33.062, E51.022
See application file for complete search history.

(56) References Cited

FOREIGN PATENT DOCUMENTS

| KR | 10-500147 | | 6/2005 |
|---|---|---|---|
| KR | 2005-88212 | | 9/2005 |
| KR | 2005-99027 | | 10/2005 |
| KR | 20070043253 | * | 10/2005 |
| KR | 2005-110905 | | 11/2005 |
| KR | 2006-19758 | | 3/2006 |
| KR | 2006-113008 | | 11/2006 |
| KR | 2007-43253 | | 4/2007 |
| WO | WO 2004112157 | * | 12/2004 |

OTHER PUBLICATIONS

Abstract of Korean Patent Publication No. 2004-62105 A published on Jul. 7, 2004.
Notice of Allowance issued by Korean Intellectual Property Office in Korean Patent Application No. 10-2008-0008723 on Apr. 30, 2009.

* cited by examiner

*Primary Examiner* — Long Pham
(74) *Attorney, Agent, or Firm* — Christie, Parker & Hale, LLP

(57) ABSTRACT

An organic light emitting diode display device to display a main image and a sub-image, such as background, illumination, or the like, without additional processes or a reduction in the resolution of the image, and a method of fabricating the same, the organic light emitting diode display device including: a substrate; a thin film transistor disposed on the substrate, including a semiconductor layer, a source electrode, a drain electrode, a gate insulating layer, and a gate electrode; an insulating layer disposed on the thin film transistor; a first lower electrode disposed on the insulating layer, electrically connected to the source electrode and the drain electrode of the thin film transistor; an auxiliary lower electrode disposed on the insulating layer, spaced apart from the first lower electrode; a first organic layer disposed on the first lower electrode, including at least one emission layer; a second organic layer disposed on the auxiliary lower electrode, including at least one emission layer; and an upper electrode disposed on the first organic layer and the second organic layer.

14 Claims, 10 Drawing Sheets

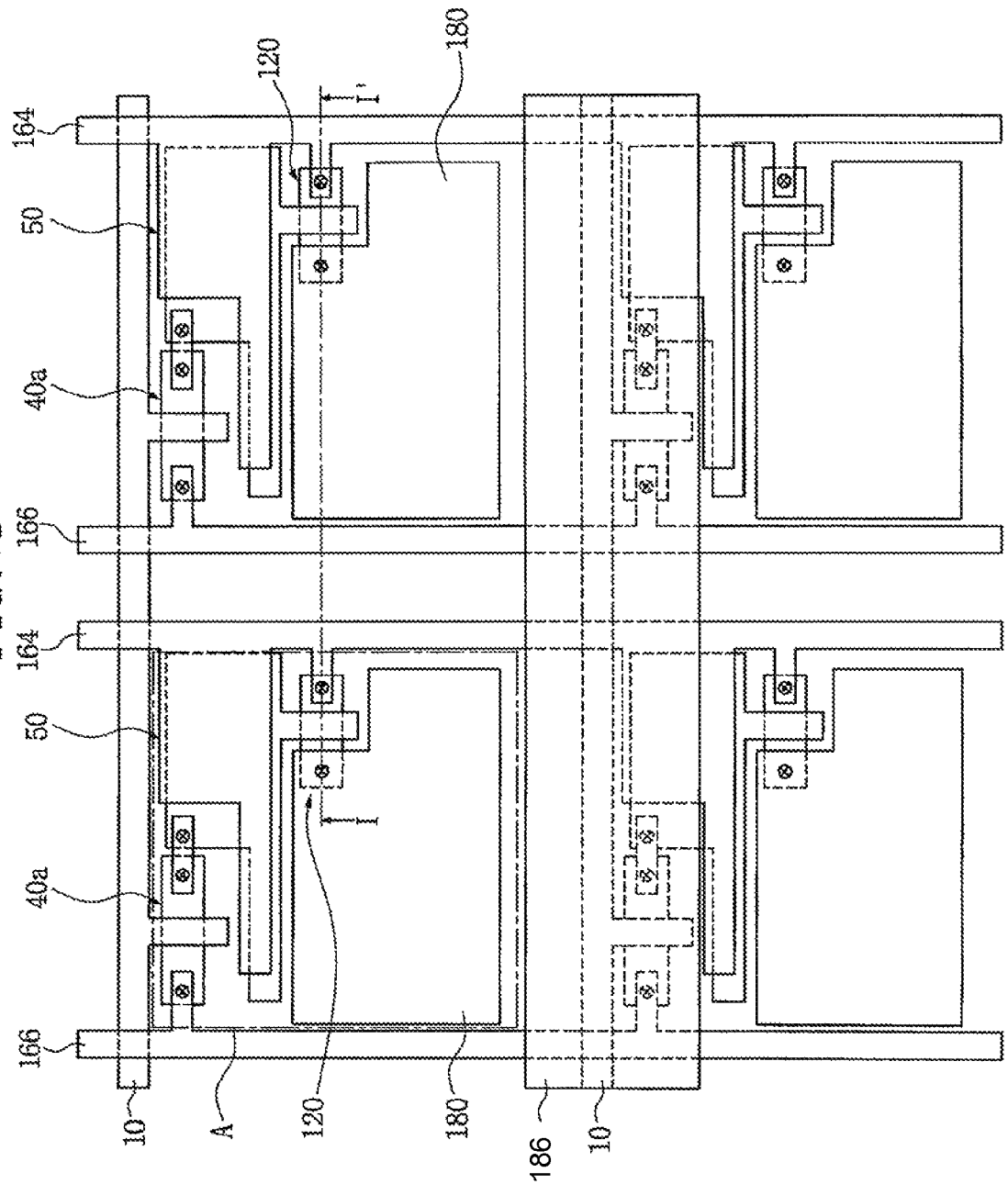

ORGANIC LIGHT EMITTING DIODE DISPLAY DEVICE AND METHOD OF FABRICATING THE SAME

CROSS-REFERENCE TO RELATED APPLICATION

This application claims the benefit of Korean Patent Application No. 2008-8723, filed Jan. 28, 2008, in the Korean Intellectual Property Office, the disclosure of which is hereby incorporated herein by reference in its entirety.

BACKGROUND OF THE INVENTION

1. Field of the Invention

Aspects of the present invention relate to an organic light emitting diode display device and a method of fabricating the same, and more particularly, to an organic light emitting diode display device capable of simultaneously displaying a main image and a sub-image, without additional processes or reduction in resolution.

2. Description of the Related Art

Flat panel display devices are lightweight and compact and so are rapidly replacing cathode ray tube display devices. Typical examples of flat panel display devices include liquid crystal display devices (LCDs) and organic light emitting diode display devices (OLEDs). OLEDs have better brightness and viewing angle characteristics than the LCDs and do not require a back light.

An OLED is a display device operates by coupling electrons and holes, which are injected through a cathode and an anode, to form excitons. The excitons return to a non-excited state, by generating light having a specific wavelength. An OLED can be classified as a passive matrix-type or an active matrix-type, depending on the driving method thereof. The active matrix-type OLED has a circuit using a thin film transistor (TFT). The passive matrix-type OLED can be readily manufactured, because its display region is formed in a simple matrix structure of anodes and cathodes. However, due to problems such as a decrease in resolution, an increase in drive voltage, and a reduction in lifespan of a material, the passive matrix OLEDs are limited to small, low resolution display devices. On the other hand, the active matrix OLEDs include thin film transistors mounted on the respective pixels of display regions, which provide a stable brightness, by applying a certain current to each pixel. In addition, low power consumption plays an important role in implementing a high resolution, large-sized display.

However, in order to simultaneously display a main image and a sub-image, such as background, illumination, or the like, since the OLED should drive a plurality of pixel regions in a divided manner, resolution of the main image may be reduced. In addition, when a separate pixel region for displaying the sub-image is formed, in order to prevent a reduction in resolution of the main image, an emission area of the pixel region for displaying the main image is reduced, resulting in a reduction in brightness, a flicker phenomenon, and reduced efficiency, due to additional processes.

SUMMARY OF THE INVENTION

Aspects of the present invention provide an organic light emitting diode display device and a method of fabricating the same. The display device is capable of simultaneously displaying a main image and a sub-image, such as a background, additional illumination, or the like, to augment the main image, without additional processes or a reduction in resolution.

Aspects of the present invention provide an organic light emitting diode display device including: a substrate; a thin film transistor disposed on the substrate, including a semiconductor layer, a source electrode, a drain electrode, a gate insulating layer, and a gate electrode; an insulating layer disposed on the thin film transistor; a first lower electrode disposed on the insulating layer, electrically connected to the source electrode and the drain electrode of the thin film transistor; an auxiliary lower electrode disposed on the insulating layer, spaced apart from the first lower electrode; a first organic layer disposed on the first lower electrode, including at least one emission layer; a second organic layer disposed on the auxiliary lower electrode, including at least one emission layer; and an upper electrode disposed on the first organic layer and the second organic layer.

Aspects of the present invention provide an organic light emitting diode display device including: a plurality of data lines to supply data signals; a plurality of scan lines to supply scan signals; a plurality of sub-pixel regions disposed in a region where the data lines intersect the scan lines, and including a third lower electrode, to which a drive current is applied according to the data signal; and a sub-pixel region including a fourth lower electrode spaced apart from the third lower electrode.

Aspects of the present invention provide a method of fabricating an organic light emitting diode display device, including: preparing a substrate; forming a thin film transistor, including a semiconductor layer, a source electrode, a drain electrode, a gate insulating layer, and a gate electrode, on the substrate; forming an insulating layer on the thin film transistor; etching a portion of the insulating layer to form a hole exposing a portion of the source electrode or the drain electrode; forming a first lower electrode that is electrically connected to the source electrode or the drain electrode, through the hole; forming an auxiliary lower electrode in a region spaced apart from the first lower electrode; forming a first organic layer, including at least one emission layer, on the first lower electrode; forming a second organic layer, including at least one emission layer, on the auxiliary lower electrode; and forming an upper electrode on the first organic layer and the second organic layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which:

FIG. 1B is a plan view of an organic light emitting diode display device, in accordance with an exemplary embodiment of the present invention.

DETAILED DESCRIPTION OF THE EXEMPLARY EMBODIMENTS

Figure 1A:
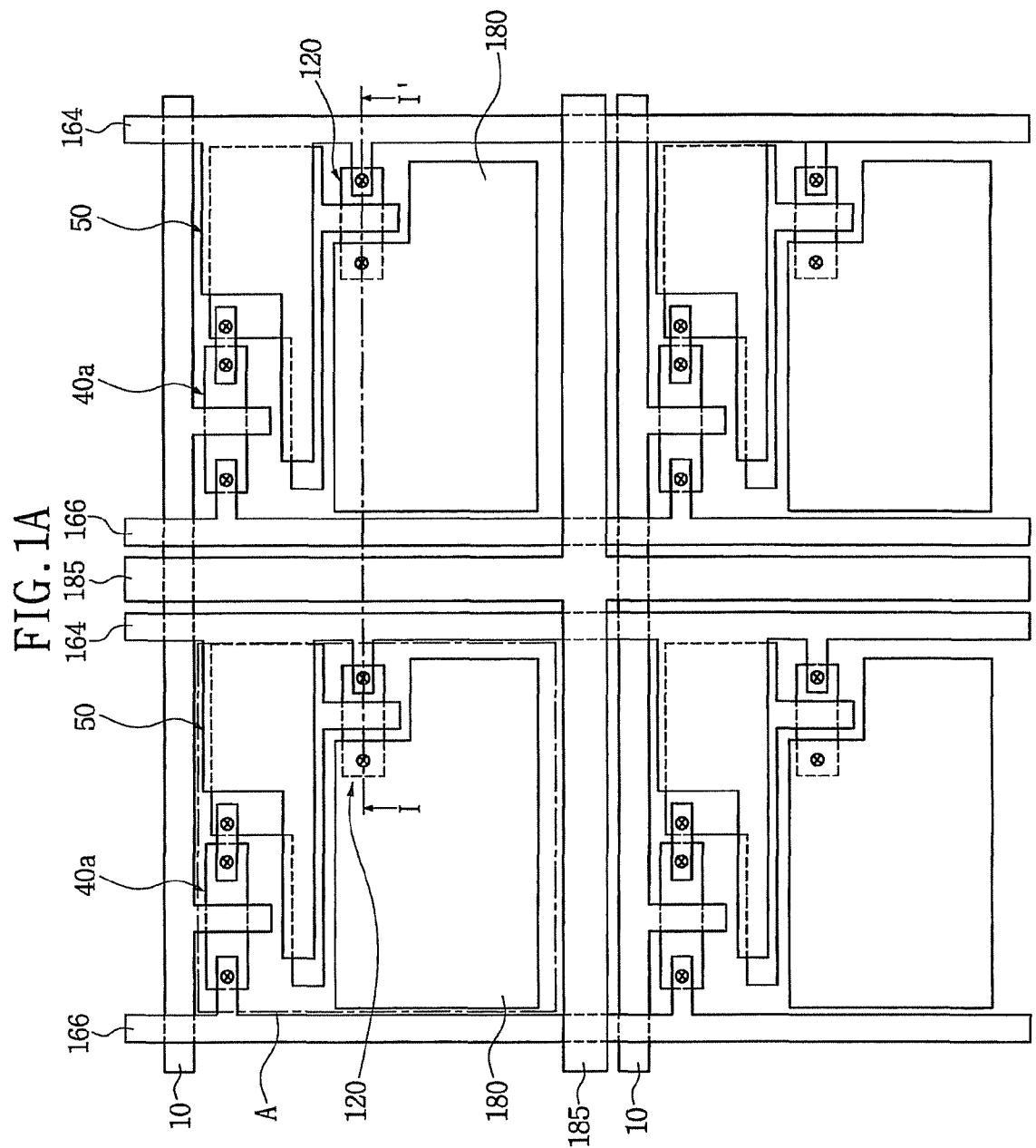
FIG. 1A is a plan view of an organic light emitting diode display device, in accordance with an exemplary embodiment of the present invention.

Aspects of the present invention will now be described with reference to the accompanying drawings, in which exemplary embodiments of the invention are shown. Like reference numerals refer to like elements throughout. When a certain part is said to be "connected" to another part, it includes the case when the certain part is "electrically connected" to another part, via an additional part, as well as the case when the parts are "directly connected" to one another. Moreover, in the drawings, the lengths and thicknesses of various components may be exaggerated for convenience.

FIG. 1A is a plan view of an organic light emitting diode display device, in accordance with an exemplary embodiment of the present invention. Referring to FIG. 1A, the organic light emitting diode display device includes: a plurality of scan lines 10 arranged in one direction; a plurality of data lines 166 arranged to intersect the scan lines 10; a plurality of power voltage supply lines 164 (drain electrodes) arranged parallel to the data lines 166; a plurality of sub-pixel regions A disposed between the scan lines 10 and the data lines 166, including first lower electrodes 180 electrically connected to the data lines 166; and a plurality of auxiliary pixel regions, which are disposed between the sub-pixel regions A. The auxiliary pixel regions include auxiliary electrodes 185.

Each sub-pixel region A includes an organic light emitting diode including: the first lower electrode 180; an upper electrode (not shown); and an organic layer disposed between the two electrodes. The organic layer includes: at least one emission layer, a driving transistor 40b to transmit a driving current, in response to a data signal supplied from the data line 166, to the first lower electrode 180; a switching transistor 40a to transmit the data signal, in response to a scan signal supplied through the scan line 10, to the driving transistor 40b; and a capacitor 50 to store the data signal. The organic layer of sub-pixel region A may include a red, a green, or a blue emission layer. The organic layers of adjacent sub-pixel regions A may include different emission layers, such that three adjacent sub-pixel regions A form a pixel.

The auxiliary electrodes 185 are spaced apart from the first lower electrodes 180 and are disposed between the sub-pixel regions A. The auxiliary electrodes 185 may be formed as a mesh comprising horizontal and vertically orientated electrodes that surround the sub-pixel regions A.

FIG. 1B is a plan view of an organic light emitting diode display device, in accordance with an exemplary embodiment of the present invention, which is similar to the organic light emitting display of FIG. 1A, except for having different auxiliary electrodes 186. As shown in FIG. 1B, the auxiliary electrodes 186 may oriented horizontally, so as to overlap part of the sub-pixel region A. In the alternative, the auxiliary electrodes 186 may be oriented vertically, so as to overlap part of the sub-pixel region A.

Figure 2A:
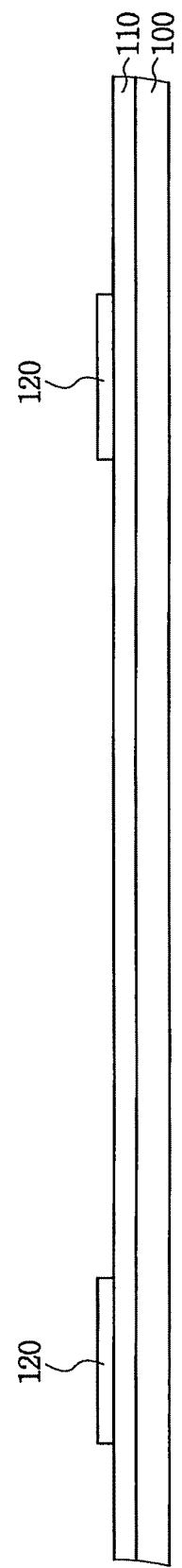
FIGS. 2A to 2H are cross-sectional views taken along line I-I' of FIG. 1A, sequentially showing manufacturing processes of the organic light emitting diode display device, in accordance with an exemplary embodiment of the present invention.

FIGS. 2A to 2H are cross-sectional views taken along line I-I' of FIG. 1A, which sequentially show a manufacturing processes of the organic light emitting diode display device, in accordance with an exemplary embodiment of the present invention. With reference to FIG. 2A, a buffer layer 110 is formed on a substrate 100. The substrate 100 can be formed of a material such as a glass, a synthetic resin, a stainless steel, and so on. While the buffer layer 110 is not required, the buffer layer 110 may be formed to prevent the diffusion of impurities from the substrate 100. The buffer layer 110 may be formed of a silicon oxide ($SiO_2$) layer, a silicon nitride ($SiN_x$) layer, or a combination thereof.

Next, an amorphous silicon layer (not shown) is formed on the buffer layer 110, and then crystallized into a polysilicon layer. The polysilicon layer is patterned to form a semiconductor layer 120. In the exemplary embodiment, the amorphous silicon layer is crystallized into the polysilicon layer, to form the semiconductor layer 120 formed of polysilicon. However, the semiconductor layer 120 may be formed of amorphous silicon.

Figure 2B:
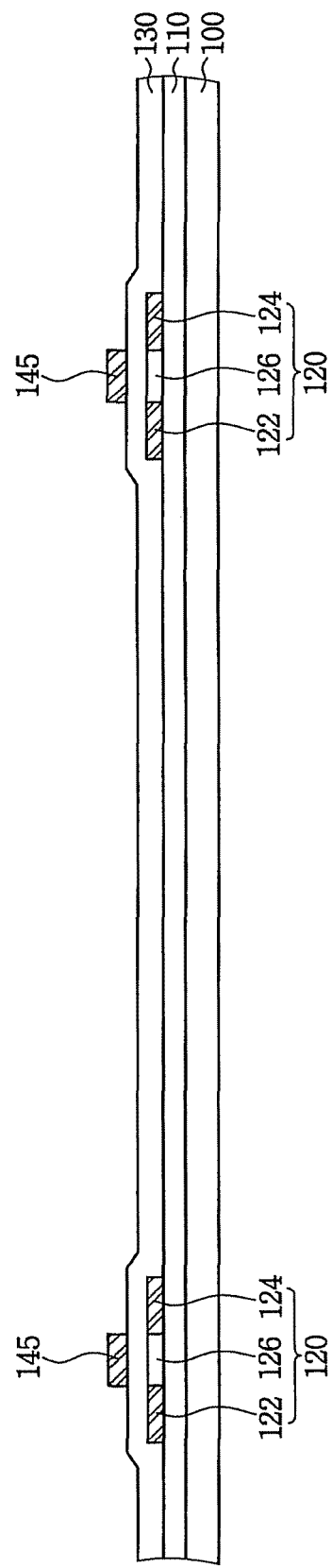

As shown in FIG. 2B, a gate insulating layer 130, formed of a silicon oxide ($SiO_2$) layer, a silicon nitride ($SiN_x$) layer, or a combination thereof, is formed on the substrate 100 and the semiconductor layer 120. Then, a gate electrode metal layer (not shown), formed of at least one selected from the group consisting of aluminum (Al), chrome (Cr), and molybdenum (Mo), is formed on the gate insulating layer 130.

Then, the gate electrode metal layer is etched by a photolithography process to form a gate electrode 145 on a certain region of the semiconductor layer 120. Conductive impurities are doped into the semiconductor layer 120, using the gate electrode 145 as a mask, thereby forming a source region 122, a drain region 124, and a channel region 126 in the semiconductor layer 120. The channel region 126 is a region of the semiconductor layer 120 corresponding to the gate electrode 145, i.e., a region in which conductive impurities are not doped, due to the gate electrode 145. In this exemplary embodiment, while a process of doping impurities into the semiconductor layer 120 is performed using the gate electrode 145 as a mask, the doping process may be performed using a photo resist, before forming the gate electrode 145.

Figure 2C:
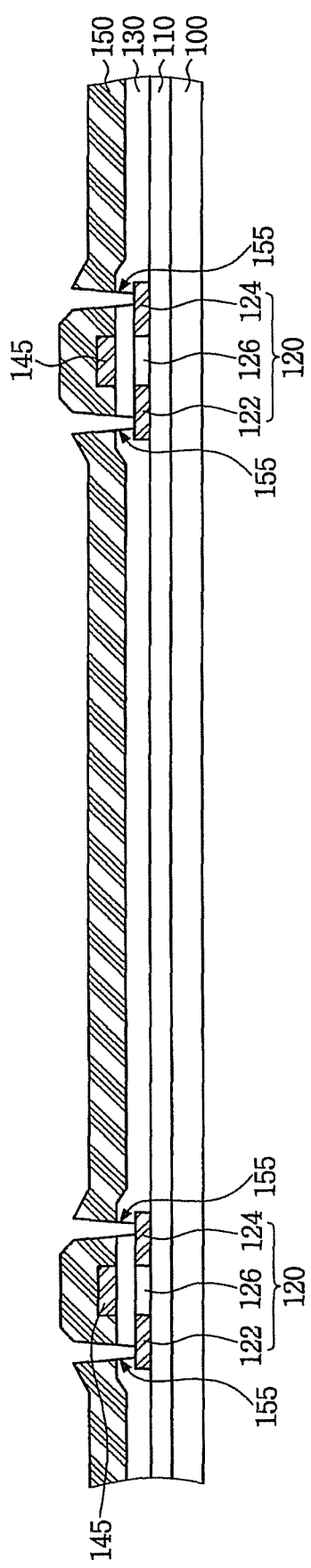

As shown in FIG. 2C, an interlayer insulating layer 150 is formed on the gate electrode 145 and the interlayer insulating layer 150. The interlayer insulating layer 150 and the gate insulating layer 130 are etched to form contact holes 155 that expose the source region 122 and the drain region 124 of the semiconductor layer 120. The interlayer insulating layer 150 may be formed of a silicon oxide ($SiO_2$) layer, a silicon nitride ($SiN_x$) layer, or a combination thereof.

Figure 2D:
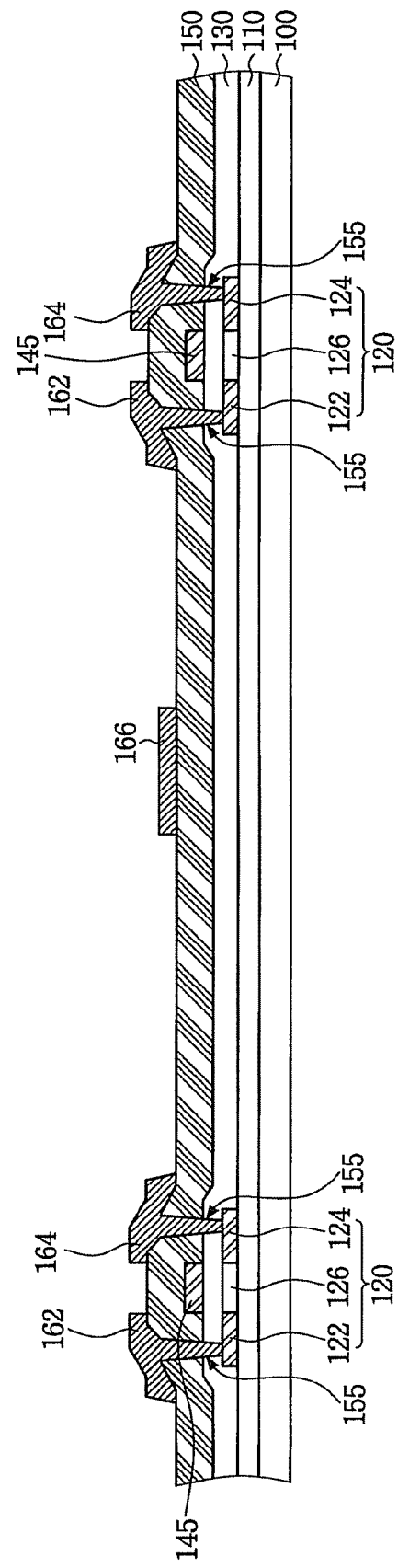

As shown in FIG. 2D, a conductive material layer (not shown) is formed on the interlayer insulating layer 150 and then patterned to form a source electrode 162 and a drain electrode 164, thereby completing a thin film transistor. The source electrode 162 is electrically connected to the source region 122, through one of the contact holes 155, and the drain electrode 164 is electrically connected to the drain region through one of the contact holes 155. The conductive material layer may be formed of a highly conductive material, such as molybdenum tungsten (MoW), aluminum (Al), an aluminum alloy, such as aluminum-neodymium (Al—Nd), or the like.

While in this exemplary embodiment, the gate electrode 145 is formed on the semiconductor layer 120, the gate electrode 145 may alternatively be formed under the semiconductor layer 120. A data line 166, or a scan line, a power voltage supply line, or the like, which is disposed between the adjacent sub-pixel regions, may be formed using a portion of the conductive material layer.

Figure 2E:
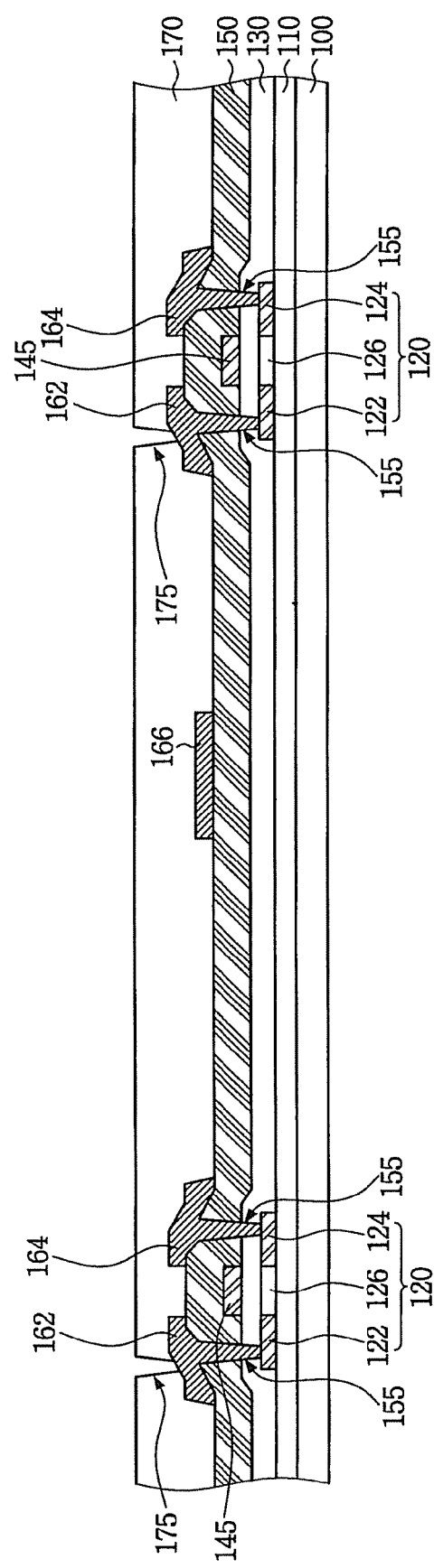

As shown in FIG. 2E, an insulating layer 170 is formed on the substrate 100. The insulating layer 170 is etched to form a hole 175, to expose the source electrode 162. The hole 175 may also be formed to expose the drain electrode 164.

The insulating layer 170 may be an inorganic layer, such as a silicon oxide ($SiO_2$) layer, a silicon nitride ($SiN_x$) layer, or a combination thereof, an organic layer formed of acryl, and so on, or a combination of the organic layer and the inorganic layer. In some embodiments the inorganic layer is formed on the thin film transistor, and the organic layer is formed on the inorganic layer, so that a first lower electrode 180 and an auxiliary lower electrode 185 can be formed on a flat surface.

Figure 2F:
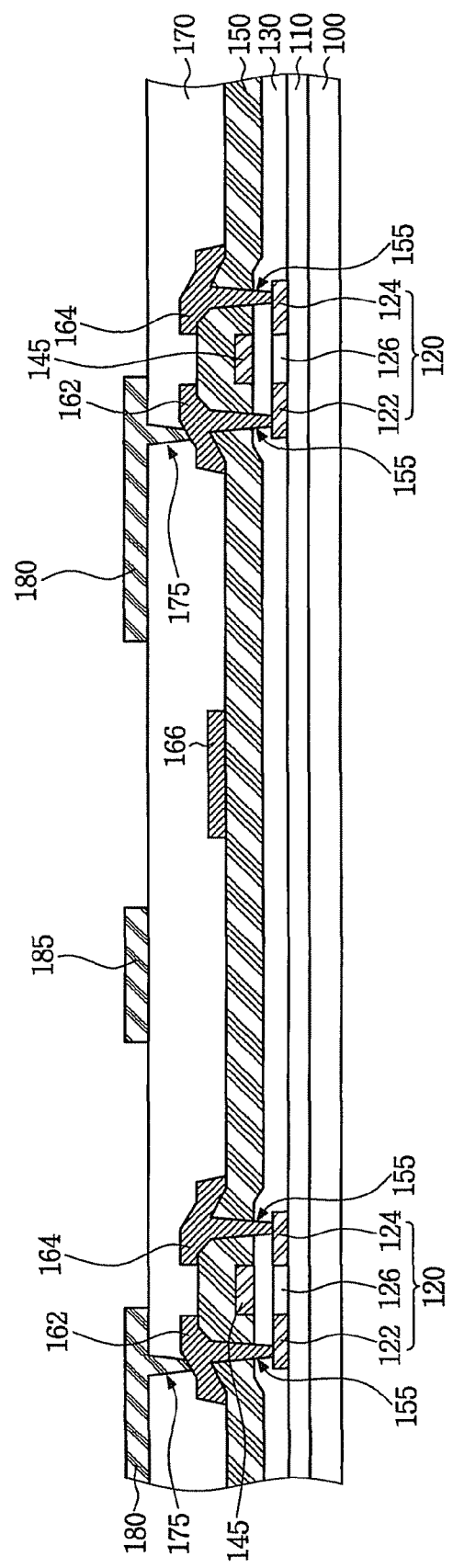
Figure 2G:
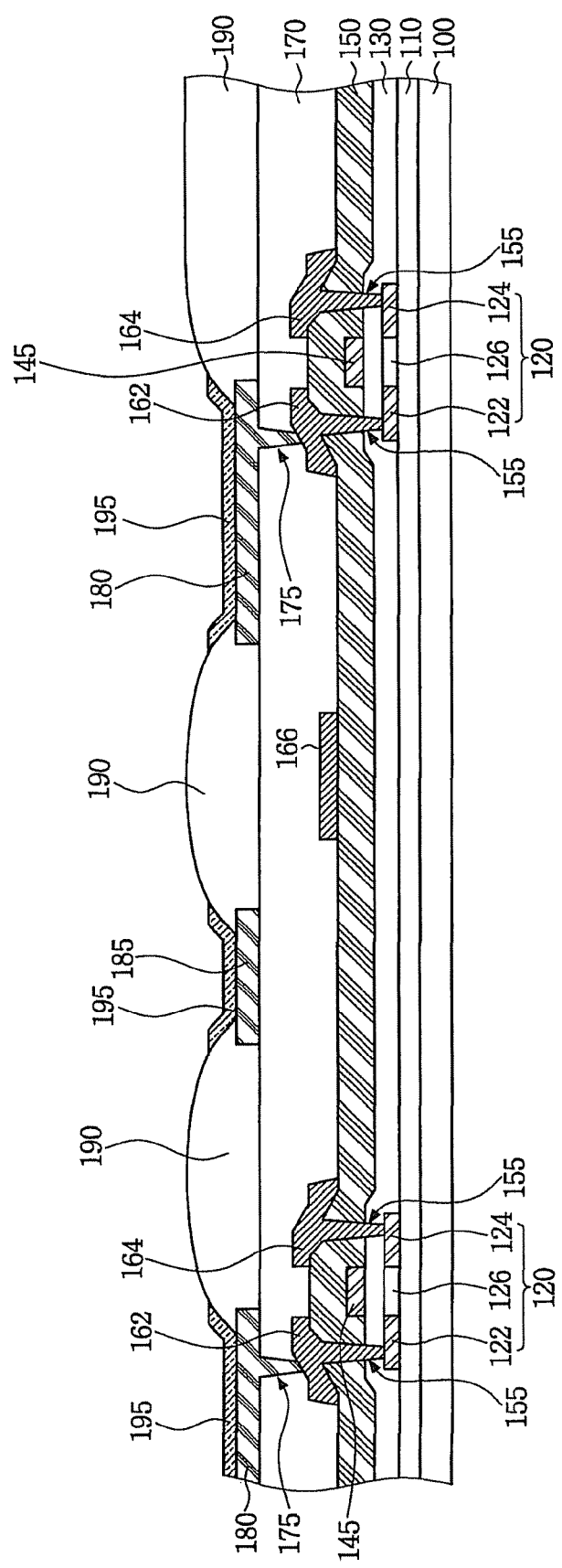

As shown in FIG. 2F, a conductive material layer (not shown) is formed on the insulating layer 170, and then patterned to form the first lower electrode 180, which is electrically connected to the source electrode 162, through the hole 175, and the auxiliary lower electrode 185, which is spaced apart from the first lower electrode 180. The first lower electrode 180 and the auxiliary lower electrode 185 may be formed of the same material, or may be formed of different conductive materials, through individual deposition processes.

The first lower electrode 180 and the auxiliary lower electrode 185 may be formed of indium tin oxide (ITO) or indium zinc oxide (IZO), so as to have conductivity, transparency, and a high work function. In order to the improve luminous efficiency of the OLED, a reflective pattern (not shown) formed of aluminum (Al) or an aluminum alloy may be formed under the first lower electrode 180 and the auxiliary lower electrode 185.

A pixel defining layer material (not shown) is deposited on the substrate 100 and then etched to form a pixel defining layer 190. The pixel defining layer 190 includes openings exposing the first lower electrode 180 and the auxiliary lower electrode 185. The pixel defining layer material may be formed of any one material selected from the group consisting of a polyimide, a benzocyclobutene series resin, a phenol resin, and an acrylate.

First and second organic layers 195 and 196, each including at least one emission layer, are respectively formed on the first lower electrode 180 and the auxiliary lower electrode 185. The first and second organic layers 195 and 196 may include different emission layers. The second organic layer 196 may include an emission layer included in the first organic layer 195 and an additional different emission layer.

The first organic layers 195, of adjacent sub-pixel regions, may include different emission layers. In this case, the second organic layer 196 between the adjacent sub-pixel regions may include all the emission layers of the adjacent first organic layers 195. The second organic layer 1966 may be formed simultaneously with the first organic layers 195 of the adjacent sub-pixel regions.

Generally, since the OLED includes a pixels including sub-pixel regions that include red, green, and blue emission layers, to display a full-color image, the first organic layers 195 of the adjacent sub-pixel regions may include at least one of the red, green, and blue emission layers, and second the organic layer 196 disposed between the adjacent sub-pixel regions may include the red, green, and blue emission layers, which are sequentially deposited.

Figure 2H:
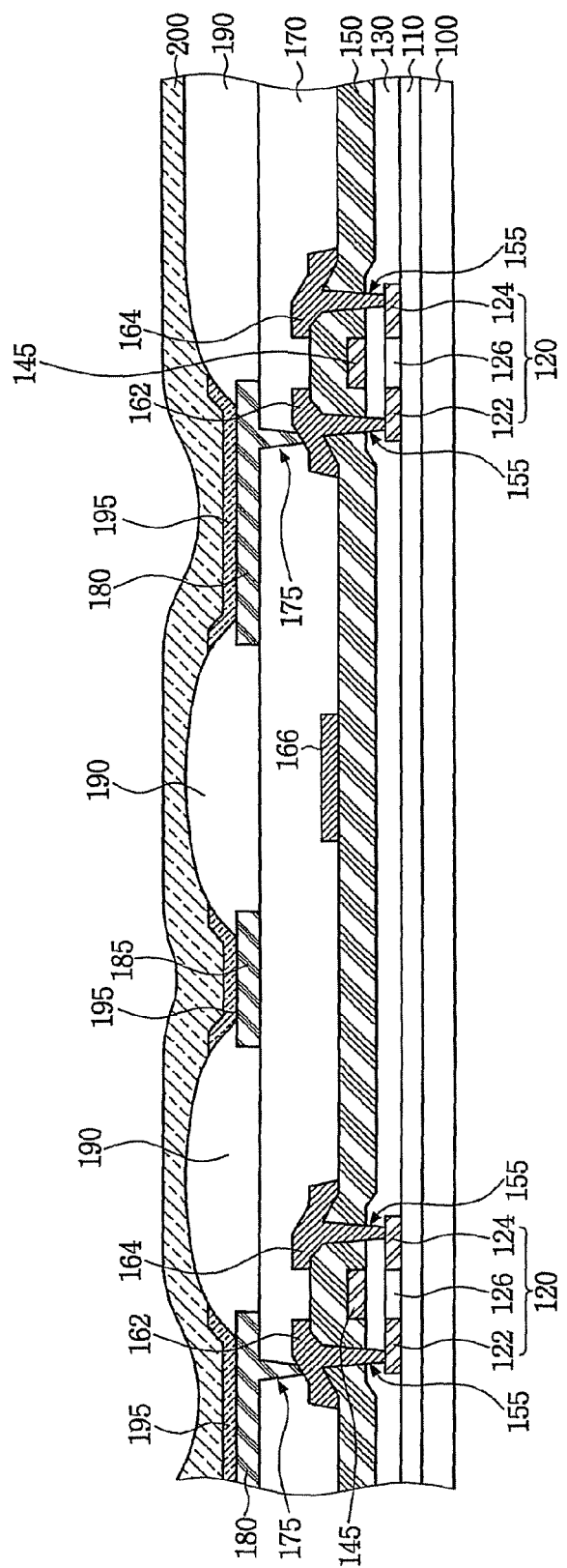

As shown in FIG. 2H, an upper electrode 200 is formed on the first organic layer 195, the second organic layer 196, and the pixel defining layer. In this exemplary embodiment, while the upper electrode 200 is commonly connected to the first organic layer 195 and the second organic layer 196, the upper electrode 200 may be separately formed.

The OLED forms an actively driven sub-pixel region, including a first lower electrode, and a passively driven sub-pixel region, including an auxiliary lower electrode, by electrically connecting the first lower electrode to the thin film transistor of the sub-pixel region. The auxiliary lower electrode is spaced apart from the first lower electrode and disposed between the sub-pixel regions. Organic layers and an upper electrode are formed on the first lower electrode and the auxiliary lower electrode.

As can be seen from the foregoing, an organic light emitting diode display device, in accordance with aspects of the present invention, can simultaneously display a main image and a sub-image, without additional processes, by electrically connecting a first lower electrode to a thin film transistor of a sub-pixel region, and separating a auxiliary lower electrode from the first lower electrode. An organic layer and an upper electrode are formed on the first lower electrode and the auxiliary lower electrode, and an actively driven sub-pixel region and a passively driven auxiliary region are also formed at the same time.

The organic light emitting diode display device can simultaneously display a main image and a sub-image, without a reduction in resolution, due to formation of sub-pixel regions and auxiliary pixel regions. The auxiliary pixel regions are disposed between the sub-pixel regions.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. An organic light emitting diode display device comprising:
    a substrate;
    thin film transistors disposed on the substrate, each of the thin film transistors comprising a semiconductor layer, a source electrode, a drain electrode, a gate insulating layer, and a gate electrode;
    an insulating layer disposed on the thin film transistors;
    first lower electrodes disposed on the insulating layer, the first lower electrodes being electrically connected to the source electrodes or the drain electrodes of the thin film transistors;
    an auxiliary lower electrode disposed on the insulating layer between the first lower electrodes, and spaced apart from the first lower electrodes;
    a first organic layer disposed on each of the first lower electrodes, the first organic layer comprising a first emission layer;
    a second organic layer disposed on the auxiliary lower electrode, the second organic layer comprising a second emission layer; and
    an upper electrode disposed on the first organic layer and the second organic layer.

2. The organic light emitting diode display device according to claim 1, wherein the first lower electrodes and the auxiliary lower electrode are formed of the same material.

3. The organic light emitting diode display device according to claim 1, wherein the first organic layer and the second organic layer comprise the same type of emission layer.

4. The organic light emitting diode display device according to claim 1, wherein the insulating layer is any one of an organic layer, an inorganic layer, and a combination thereof.

5. The organic light emitting diode display device according to claim 1, further comprising a pixel defining layer disposed on the insulating layer, having openings that expose the first lower electrodes and the auxiliary lower electrode.

6. An organic light emitting diode display device comprising:
    data lines to supply data signals;
    scan lines disposed across the data lines, to supply scan signals;
    sub-pixel regions disposed between the data lines and the scan lines, each of the sub-pixel regions comprising a first lower electrode to receive a drive current, according to the data signals; and an auxiliary pixel region disposed between the sub-pixel regions, the auxiliary pixel region comprising an auxiliary lower electrode that is separated from, and extends between, the first lower electrodes of the sub-pixel regions.

7. The organic light emitting diode display device according to claim 6, further comprising:
   first organic layers disposed on the first lower electrodes, each of the first organic layers comprising an emission layer;
   second organic layers disposed on the auxiliary lower electrode, each of the second organic layers comprising an emission layer; and
   an upper electrode disposed on the organic layers, on the first lower electrodes, and on the auxiliary lower electrode.

8. The organic light emitting diode display device according to claim 7, wherein the first and second organic layers comprise the same type of emission layer.

9. The organic light emitting diode display device according to claim 7, wherein the first organic layers of adjacent ones of the sub-pixel regions have different types of emission layers.

10. The organic light emitting diode display device according to claim 9, wherein one of the second organic layers is disposed between adjacent sub-pixel regions of the sub-pixel regions and comprises the same types of emission layers as the adjacent sub-pixel regions.

11. The organic light emitting diode display device according to claim 10, wherein the one of the second organic layers comprises sequentially deposited red, green, and blue emission layers.

12. The organic light emitting diode display device according to claim 6, wherein the sub-pixel regions each comprise:
   an organic light emitting diode comprising one of the first lower electrodes, an upper electrode, and an organic layer comprising an emission layer, disposed between the one of the first lower electrodes and the upper electrode;
   a driving transistor to transmit the drive current to the one of the first lower electrodes, in response to one of the data signals;
   a capacitor to store the one of the data signals; and
   a switching transistor to transmit the one of the data signals to a gate electrode of the driving transistor, in response to one of the scan signals.

13. The organic light emitting diode display device according to claim 6, wherein a portion of the auxiliary lower electrode is parallel to at least one of the data lines and the scan lines.

14. The organic light emitting diode display device according to claim 13, wherein the auxiliary lower electrode is mesh-shaped.

* * * * *